US011460659B2

(12) United States Patent
Wu et al.

(10) Patent No.: US 11,460,659 B2
(45) Date of Patent: Oct. 4, 2022

(54) OPTICAL AND OPTOELECTRONIC ASSEMBLIES INCLUDING MICRO-SPACERS, AND METHODS OF MANUFACTURING THE SAME

(71) Applicant: ams Sensors Singapore Pte. Ltd, Singapore (SG)

(72) Inventors: Guo Xiong Wu, Singapore (SG); Ming Jie Lee, Singapore (SG); Simon Gubser, Weesen (CH); Qichuan Yu, Singapore (SG); Joon Heng Tan, Singapore (SG)

(73) Assignee: AMS Sensors Singapore Pte. Ltd, Singapore (SG)

( * ) Notice: Subject to any disclaimer, the term of this patent is extended or adjusted under 35 U.S.C. 154(b) by 91 days.

(21) Appl. No.: 16/717,239

(22) Filed: Dec. 17, 2019

(65) Prior Publication Data

US 2020/0124831 A1     Apr. 23, 2020

Related U.S. Application Data

(63) Continuation of application No. 15/631,395, filed on Jun. 23, 2017, now Pat. No. 10,551,596.
(Continued)

(51) Int. Cl.
*G02B 7/00*      (2021.01)
*G02B 13/16*     (2006.01)
(Continued)

(52) U.S. Cl.
CPC ............... *G02B 7/006* (2013.01); *G02B 5/20* (2013.01); *G02B 13/0085* (2013.01);
(Continued)

(58) Field of Classification Search
CPC ......... H01S 5/0225; G02B 7/006; G02B 7/00; G02B 5/20; G02B 5/201; G02B 5/208;
(Continued)

(56) References Cited

U.S. PATENT DOCUMENTS 5,754,003 A    5/1998  Murai et al.
6,153,973 A   11/2000  Shibata et al.
(Continued)

FOREIGN PATENT DOCUMENTS

EP      1858086 A1     11/2007
KR    10-1580581       12/2015
(Continued)

OTHER PUBLICATIONS

Chinese Search Report issued for the corresponding CN patent application No. CN 106121629 A, 1 page (For informational purposes only).
(Continued)

*Primary Examiner* — William R Alexander
(74) *Attorney, Agent, or Firm* — Viering, Jentschura & Partner MBB

(57) ABSTRACT

The present disclosure describes optical and optoelectronic assemblies that, in some cases, include screen-printed micro-spacers, as well as methods for manufacturing such assemblies and modules. For example, an optoelectronic device mounted on a substrate can include an optical sub-assembly including a first optical element and a first micro-spacer on the optical element. The optical sub-assembly can be disposed over the optoelectronic device, with a first air or vacuum gap separating the first optical element from the optoelectronic device, and the first micro-spacer laterally surrounding the first air or vacuum gap.

6 Claims, 11 Drawing Sheets

Related U.S. Application Data

(60) Provisional application No. 62/459,245, filed on Feb. 15, 2017, provisional application No. 62/408,183, filed on Oct. 14, 2016, provisional application No. 62/356,161, filed on Jun. 29, 2016.

(51) Int. Cl.

| | | |
|---|---|---|
| *H01L 31/0232* | (2014.01) | |
| *H01L 31/18* | (2006.01) | |
| *H01S 5/0225* | (2021.01) | |
| *G02B 5/20* | (2006.01) | |
| *G02B 13/00* | (2006.01) | |
| *H01L 27/146* | (2006.01) | |
| *H01L 31/0203* | (2014.01) | |
| *H01L 33/50* | (2010.01) | |
| *H01L 33/52* | (2010.01) | |
| *H01L 33/58* | (2010.01) | |
| *G02B 5/28* | (2006.01) | |

(52) U.S. Cl.
CPC ........ *G02B 13/16* (2013.01); *H01L 27/14618* (2013.01); *H01L 27/14625* (2013.01); *H01L 27/14685* (2013.01); *H01L 31/0203* (2013.01); *H01L 31/02325* (2013.01); *H01L 31/02327* (2013.01); *H01L 31/1876* (2013.01); *H01L 33/507* (2013.01); *H01L 33/52* (2013.01); *H01L 33/58* (2013.01); *H01S 5/0225* (2021.01); *G02B 5/201* (2013.01); *G02B 5/208* (2013.01); *G02B 5/28* (2013.01); *H01L 2933/005* (2013.01); *H01L 2933/0041* (2013.01); *H01L 2933/0058* (2013.01)

(58) Field of Classification Search
CPC ...... G02B 5/28; G02B 13/0085; G02B 13/16; H01L 27/14618; H01L 27/14625; H01L 27/14685; H01L 31/0203; H01L 31/02325; H01L 31/02327; H01L 31/1876; H01L 33/507; H01L 33/52; H01L 33/58
USPC ............................................ 257/98; 359/819
See application file for complete search history.

(56) References Cited

U.S. PATENT DOCUMENTS

| | | | |
|---|---|---|---|
| 6,155,900 A | 12/2000 | Hofmann et al. | |
| 7,362,494 B2 | 4/2008 | Huibers et al. | |
| 8,606,057 B1 | 12/2013 | Rudmann et al. | |
| 8,792,044 B2* | 7/2014 | Imai | H04N 5/2257 348/340 |
| 8,953,087 B2* | 2/2015 | Feldman | G02B 13/0035 348/340 |
| 9,063,005 B2 | 6/2015 | Rudmann et al. | |
| 9,478,681 B2 | 10/2016 | Gubser et al. | |
| 9,634,051 B2 | 4/2017 | Heimgartner et al. | |
| 10,498,943 B2* | 12/2019 | Chan | H01L 24/48 |
| 2002/0027635 A1 | 3/2002 | Sakamaki et al. | |
| 2003/0010431 A1 | 1/2003 | Feldman et al. | |
| 2003/0146384 A1 | 8/2003 | Logsdon et al. | |
| 2003/0223216 A1 | 12/2003 | Emmons et al. | |
| 2004/0246612 A1 | 12/2004 | Niwa | |
| 2005/0116924 A1 | 6/2005 | Sauvante et al. | |
| 2007/0058260 A1 | 3/2007 | Steenblik et al. | |
| 2007/0134438 A1 | 6/2007 | Fabick et al. | |
| 2007/0190747 A1 | 8/2007 | Humpston et al. | |
| 2007/0241417 A1 | 10/2007 | Huibers et al. | |
| 2007/0275505 A1* | 11/2007 | Wolterink | G02B 13/006 438/118 |
| 2008/0049166 A1 | 2/2008 | Ha et al. | |
| 2008/0179503 A1* | 7/2008 | Camargo | H01L 33/54 257/E33.059 |
| 2008/0278954 A1 | 11/2008 | Speier | |
| 2010/0321564 A1* | 12/2010 | Feldman | G02B 13/0085 348/374 |
| 2012/0134028 A1* | 5/2012 | Maruyama | H01L 27/14627 359/601 |
| 2012/0218455 A1* | 8/2012 | Imai | G02B 13/001 348/340 |
| 2013/0272649 A1 | 10/2013 | Braunisch et al. | |
| 2013/0280554 A1 | 10/2013 | Yamazaki et al. | |
| 2014/0021491 A1 | 1/2014 | Meng et al. | |
| 2014/0361200 A1 | 12/2014 | Rudmann et al. | |
| 2015/0115413 A1 | 4/2015 | Rudmann | |
| 2015/0292709 A1 | 10/2015 | Petronius et al. | |
| 2015/0308639 A1 | 10/2015 | Keranen et al. | |
| 2016/0218239 A1* | 7/2016 | Gubser | H01L 51/5237 |
| 2016/0247976 A1 | 8/2016 | Rudmann et al. | |
| 2016/0306265 A1 | 10/2016 | Riel et al. | |
| 2017/0077436 A1 | 3/2017 | Yue et al. | |
| 2017/0207374 A1* | 7/2017 | Gubser | H01S 5/02 |
| 2018/0205857 A1* | 7/2018 | Chan | H01L 21/561 |
| 2020/0365778 A1* | 11/2020 | Gubser | H01L 33/54 |

FOREIGN PATENT DOCUMENTS

| | | |
|---|---|---|
| TW | 200737431 A | 10/2007 |
| TW | 200921234 A | 5/2009 |
| TW | 201335653 A | 9/2013 |
| WO | 2015038064 A2 | 3/2015 |
| WO | 2015/160309 | 10/2015 |
| WO | 2016163953 A1 | 10/2016 |
| WO | 2017007425 A1 | 1/2017 |
| WO | 2017/034483 | 3/2017 |

OTHER PUBLICATIONS

Chinese Search Report issued for the corresponding CN patent application No. CN 106121632 A, 2 pages (For informational purposes only).

International Search Report issued for the PCT patent application No. PCT/SG2017/050319, dated Sep. 28, 2017, 2 pages (For informational purposes only).

* cited by examiner

OPTICAL AND OPTOELECTRONIC ASSEMBLIES INCLUDING MICRO-SPACERS, AND METHODS OF MANUFACTURING THE SAME

CROSS-REFERENCE TO RELATED APPLICATION(S)

This is a Continuation Application of U.S. patent application Ser. No. 15/631,395, filed Jun. 23, 2017, which claims the benefit of priority of U.S. Provisional Application No. 62/459,245 filed on Feb. 15, 2017; U.S. Provisional Application No. 62/408,183 filed on Oct. 14, 2016; and U.S. Provisional Application No. 62/356,161 filed on Jun. 29, 2016, the entire contents of which being incorporated herein by reference.

FIELD OF THE DISCLOSURE

The present disclosure relates to optical and optoelectronic assemblies that include micro-spacers, as well as methods for manufacturing such assemblies.

BACKGROUND

Small optoelectronic modules such as imaging devices and light projectors employ optical assemblies that include lenses or other optical elements stacked along the device's optical axis to achieve desired optical performance. In some applications, it is desirable for there to be a gap (e.g., air or vacuum) on one or both sides of some of the optical elements through which the device's optical path passes. The air (or vacuum) gaps can help ensure that the optical elements provide the desired optical effect on light signals as they pass through each optical element. The gaps also can help prevent chemical interactions between the optical elements and surrounding materials. Such chemical interactions may adversely impact the optical properties of the optical elements.

Manufacturing assemblies or modules with such gaps, however, is non-trivial. Among other things, in many applications, space is at a premium. Thus, it can be important to maintain a relatively small overall z-height for the module or optical assembly. Since the introduction of the air (or vacuum) gaps generally increases the overall height of the assembly or module, it would be desirable to provide techniques that allow the gaps to be made relatively thin.

SUMMARY

The present disclosure describes optical and optoelectronic assemblies that include micro-spacers, as well as methods for manufacturing such assemblies.

For example, in one aspect, a method includes applying first micro-spacers onto a first optical element layer, wherein the first micro-spacers are laterally separated from one another. The method also includes providing a second optical element layer on the first micro-spacers.

Some implementations include one or more of the following features. For example, by providing the second optical element layer on the first micro-spacers, the second optical element layer and the first optical element layer can be separated from one another by air or vacuum gaps each of which is laterally surrounded by a portion of the first micro-spacers. The micro-spacers can be composed, for example, of an adhesive material. In some instances, the first and second micro-spacers are formed of a curable material, and the material of the first micro-spacers partially is cured prior to forming the second micro-spacers on the second optical element layer. In some cases, the method further includes forming second micro-spacers on the second optical element layer. The micro-spacers can be formed, for example, by a screen-printing, auger valve dispensing or jetting technique. In some cases, the micro-spacers can be formed by applying a die-cut pressure sensitive layer on one of the optical element layers.

In some instances, at least one of the first or second optical element layers comprises an IR absorber layer, a dielectric optical filter layer, or an optical interference filter layer. In some cases, providing a second optical element layer on the first micro-spacers includes rolling the second optical element layer on the first micro-spacers. Further, in some cases, providing a second optical element layer on the first micro-spacers includes using a vacuum chuck to place the second optical element layer on the first micro-spacers. In some implementations, the micro-spacers can be relatively thin (e.g., a thickness in a range of 20-50 microns).

The method can include separating the first and second optical element layers to form a multitude of optical sub-assemblies each of which includes first and second optical elements separated by an air or vacuum gap laterally surrounded by a micro-spacer.

In another aspect, an apparatus includes a first optical element, a second optical element separated from the first optical element by an air or vacuum gap, and a first micro-spacer on the first optical element or on the second optical element, and laterally surrounding the air or vacuum gap.

Some implementations include one or more of the following features. For example, a second micro-spacer can be on the second optical element. In some cases, at least one of the first or second optical elements comprises an IR absorber, a dielectric optical filter, or an optical interference filter. In some instances, the micro-spacers are composed of a cured material. In some implementations, the micro-spacers are screen-printed, auger valve dispensed or jetted micro-spacers. In some cases, the micro-spacers are die-cut pressure sensitive layers. The micro-spacers can be composed, for example, of an adhesive. In some implementations, the micro-spacers are relatively, thin (e.g., a thickness in a range of 20-50 microns).

In another aspect, an optoelectronic module includes an optoelectronic device mounted on a substrate. The module also includes an optical sub-assembly that includes a first optical element and a first micro-spacer on the optical element. The optical sub-assembly is disposed over the optoelectronic device, a first air or vacuum gap separates the first optical element from the optoelectronic device, and the first micro-spacer laterally surrounds the first air or vacuum gap.

In some instances, the optical sub-assembly includes a second optical element, the first and second optical elements being separated by a second air or vacuum gap laterally surrounded by a second micro-spacer. Likewise, in some cases, the module includes another optical sub-assembly including third and fourth optical elements separated by a second air or vacuum gap laterally surrounded by a second micro-spacer. Each micro-spacer can be composed, for example, of an adhesive material.

Some implementations provide one or more of the following advantages. For example, in some cases, the air or vacuum gaps can be provided adjacent the optical elements without significantly increasing the overall height of the sub-assemblies and modules. The ability to form the micro-spacers as part of wafer-level processes can facilitate manufacture of sub-assemblies and modules on a large scale.

In accordance with another aspect, the present disclosure describes modules that include an optoelectronic sub-assembly including an optoelectronic device mounted on a substrate, walls laterally surrounding the optoelectronic device, and a first ledge projecting from the walls laterally toward an interior region of the module. The walls and the first ledge form a unitary piece composed of the same material as one another. The module also includes an optical assembly supported by the first ledge such that the optical assembly is disposed over the optoelectronic device.

In some implementations, the walls are composed of a material that is opaque to a wavelength of radiation emitted or detectable by the optoelectronic device. The first ledge can be, for example, annular shaped. The walls also can include a second ledge to support an optoelectronic component over the optical assembly. The second ledge can be annular shaped as well. In some instances, the second ledge has a diameter greater than a diameter of the first ledge. The module also can include a light guide supported by the second ledge.

The disclosure also describes methods of fabricating the various sub-assemblies and modules.

Various examples are described in greater detail below. Other aspects, features and advantages will be readily apparent from the following detailed description, the accompanying drawings and the claims.

DETAILED DESCRIPTION

Figure 1:
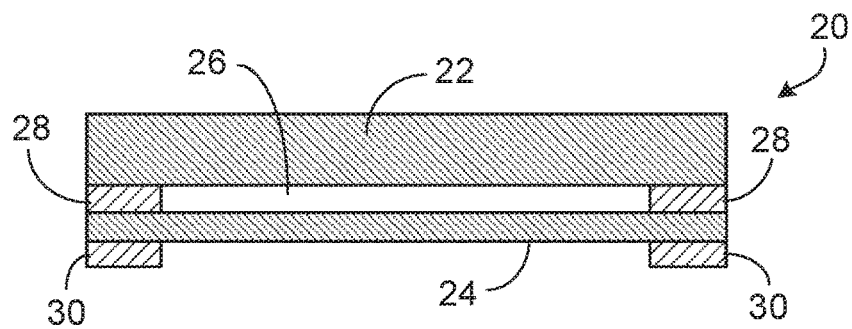
FIG. 1 illustrates an example of an optical sub-assembly that includes micro-spacers.

As shown in FIG. 1, an example of an optical subassembly 20 includes a stack of optical elements. In some implementations, one or both of the optical elements 22, 24 can be a dielectric filter or interference filter designed to operate in contact with a particular refractive index (e.g., air or vacuum). Further, in some implementations, one or both of the optical elements 22, 24 is a polymer-based filter (e.g., an IR absorber). If placed in direct contact, for example, with other polymers or epoxy materials, such filters can interact chemically in a manner that adversely effects the optical properties of the filters. In some implementations, one or both of the optical elements 22, 24 are diffusers (e.g., diffuser foils) that may be designed to operate in contact with a particular refractive index (e.g., air or vacuum).

In the illustrated example, the stack of optical elements includes a first optical element 22 and a second optical element 24 separated from one another by a small air or vacuum gap 26. First and second micro-spacers 28, 30 are deposited, respectively, on either side of the second optical element 24. Each of the micro-spacers 28, 30 can have, for example, an annular shape or a closed rectangular loop shape that laterally surrounds the air or vacuum gap 26. Thus, the first micro-spacer 28 separates the first and second optical elements 22, 24 from one another and establishes a small fixed distance between them. The second micro-spacer 30 projects from the opposite side of the second optical element 24 and can be used to establish another small air or vacuum gap between the second optical element 24 and a device over which the subassembly 20 is mounted.

Figure 2:
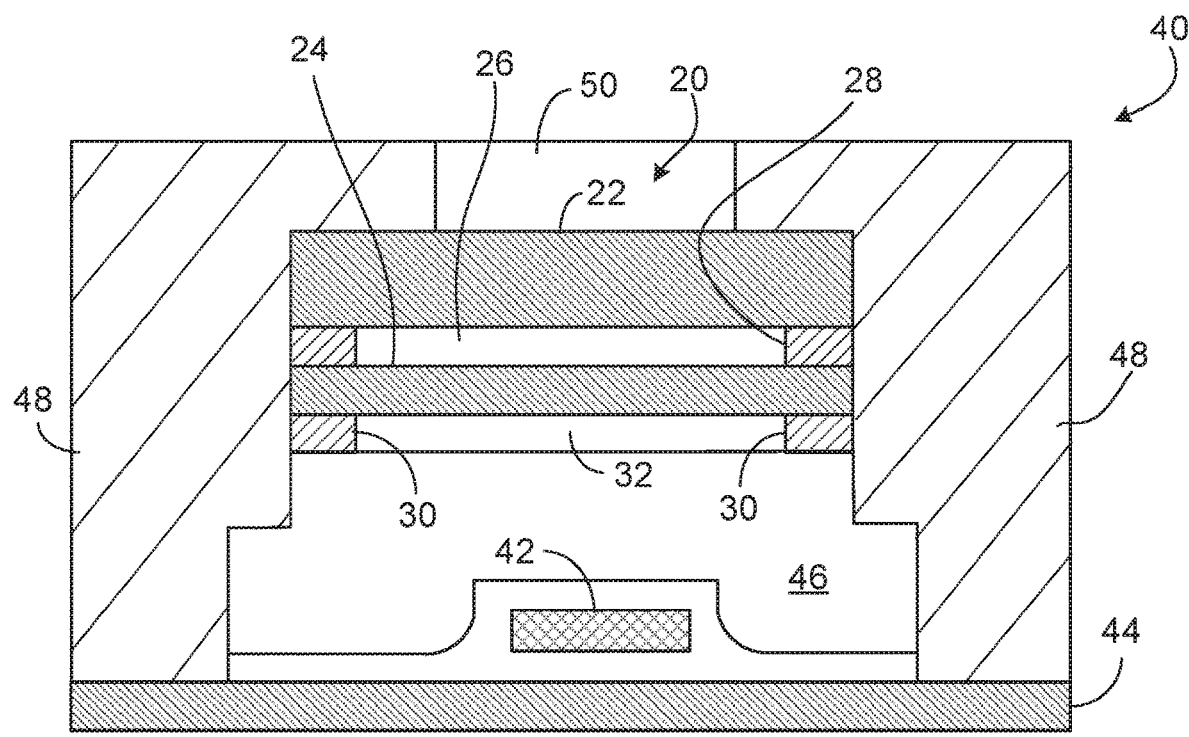
FIG. 2 illustrates an example of an optoelectronic module that includes the optical sub-assembly of FIG. 1.

For example, as shown in FIG. 2, the subassembly 20 can be integrated into an optoelectronic module 40 that includes, for example, an active optoelectronic device 42 mounted on a substrate such as a printed circuit board 44. The device 42 can be, for example, a light emitter (e.g., light emitting diode (LED), infra-red (IR) LED, organic LED (OLED), infra-red (IR) laser or vertical cavity surface emitting laser (VCSEL)) or a light sensor (e.g., a CCD or CMOS sensor) that includes radiation sensitive elements (e.g., pixels). In some cases, the device 42 is implemented as an integrated circuit (IC) semiconductor chip or as an application-specific integrated circuit (ASIC) semiconductor chip.

A clear encapsulant 46 can cover the device 42, and the sub-assembly 20 can be placed on the encapsulant 46 such that the second micro-spacer 30 rests on the surface of the encapsulant. In this manner, a second air or vacuum gap 32 can be provided between the second optical element 24 and the encapsulant 46. The encapsulant 46 should be substantially transparent to the particular wavelength(s) emitted by or detectable by the device 42. On the other hand, outer walls 48 of the module 40 can be composed of a material that is substantially opaque to the particular wavelength(s) emitted by or detectable by the device 42. For example, the outer walls 48, which laterally surround the device 42 and the sub-assembly 20, can be composed of a cured flowable polymer material (e.g., epoxy, acrylate, polyurethane, or silicone) containing a non-transparent filler (e.g., carbon black, a pigment, an inorganic filler, or a dye). In some instances, the opaque material of the walls 48 can extend partially over the surface of the first optical element 22 so as to define an opening 50 for the emission (or reception) of light signals out of (of into) the module 40.

The following paragraphs describe an example of a wafer-level method of manufacturing modules 40 including sub-assemblies 20 that include micro-spacers 28, 30. Wafer-level processes allow multiple sub-assemblies and/or modules to be fabricated at the same time in parallel.

Figure 3:
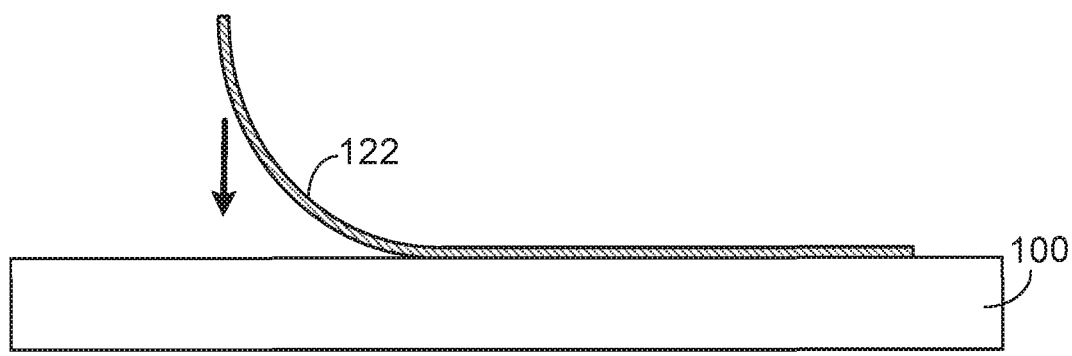
FIGS. 3, 4A, 4B, 5, 6, 7, 8, 9 and 10 illustrate steps in a wafer-level manufacturing process for making optoelectronic modules.
Figure 4A:
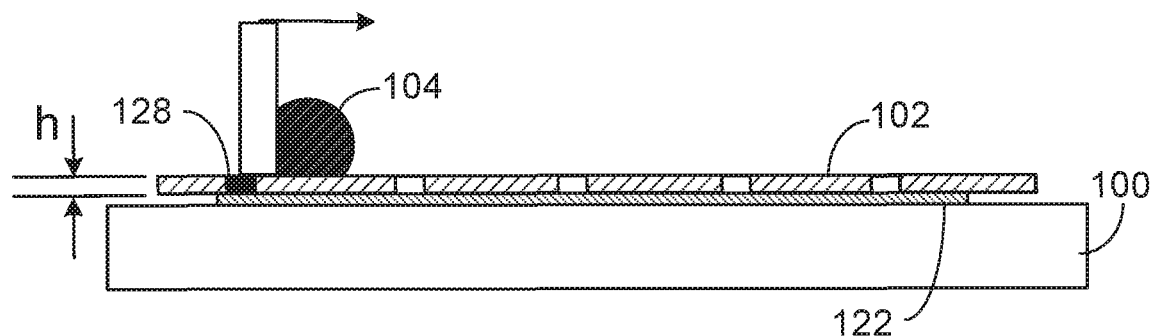
Figure 4B:
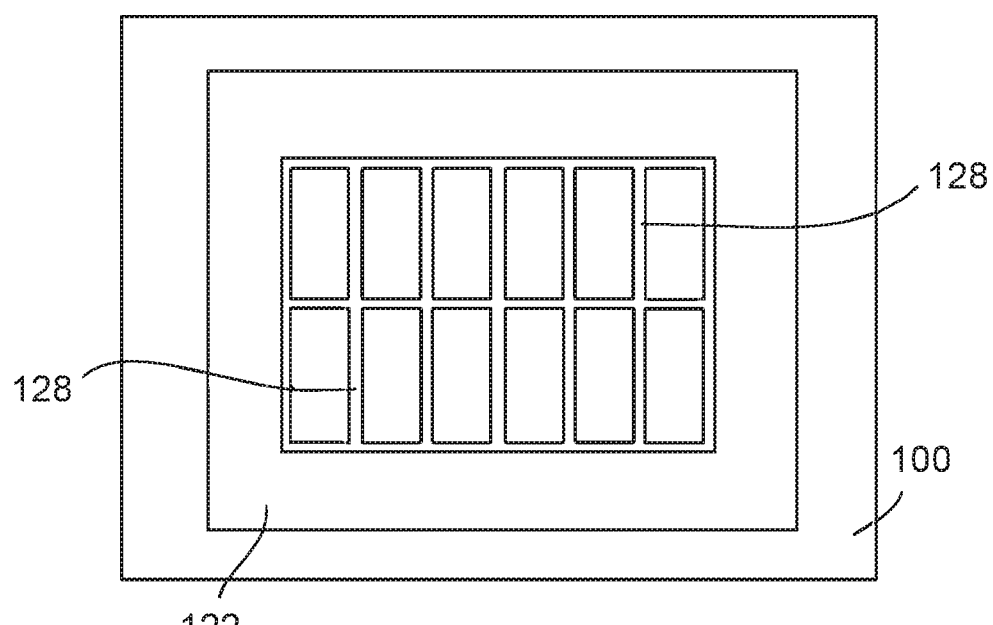

As shown in FIG. 3, a first optical element layer 122 is mounted on a substrate 100 composed, for example, of polydimethylsiloxane (PDMS), which provides good adherence, but which allows the substrate to be removed relatively easily during subsequent processing. In some instances, the substrate 100 is implemented as a double-sided UV-curable tape mounted on a glass carrier. Depending on the implementation the first optical element layer 122 can be, for example, an IR absorber layer, a dielectric optical filter layer, or an optical interference filter layer. Next, as shown in FIG. 4A, first micro-spacers 128 are formed on the surface of the first optical element layer 122. FIG. 4B illustrates an example of a top view of the micro-spacers 128. The micro-spacers 128 can have a height (h) in some instances on the order of tens of microns (e.g., 20-50 .mu.m).

Various techniques can be used to provide the micro-spacers 128. For example, in some implementations, a screen-printing, auger valve dispensing or jetting technique can be used. In some cases, the micro-spacers 128 can be formed by applying a die-cut pressure sensitive layer on one of the optical element layers 122, 124.

In the present context, screen printing refers to a technique whereby material (e.g., adhesive) is pushed through apertures in a mesh or other screen onto a substrate (e.g., an optical element layer), except in areas impermeable to the adhesive. For example, adhesive (e.g., a black, heat curable epoxy such as LOCTITE® 3128™ epoxy available from Henkel Technologies) 104 can be pushed through apertures in a screen 102 for formation of the micro-spacers 128. A blade or squeegee can be moved across the screen to fill the open screen apertures with adhesive. Auger valve dispensing can, in some implementations, include depositing the adhesive by using a motor-operated dispensing technique in which a motor rotates an auger valve screw. The adhesive can be pushed onto the auger valve screw, for example, from a feed tube. As the auger screw rotates, the adhesive is dispensed from a needle.

Depending on the implementation, dispense jetting technologies can use, e.g., a mechanically, electrically, or pneumatically actuated piston with a ball tip to impel adhesive through a narrow orifice at the end of the jet nozzle. For example, air pressure can raise the piston, allowing adhesive to flow around it into the nozzle. When air pressure is removed, a spring returns the piston so the ball again sits in the nozzle orifice. As the ball re-seats, it shoots a droplet of adhesive out the end of the nozzle. Adjusting the nozzle orifice, air and fluid pressure control droplet size. Precise heat control at the nozzle can maintain the adhesive temperature at an optimum viscosity for jetting, and can reduce variation in production. Small dots propelled from the jetting mechanism at rates, for example, up to 200 Hz in various software-controlled modes (e.g., distance-based, time-based, fixed number of dots per line, or continuous line with breaks) enable the construction of many different sizes and shapes of dots and lines. Because the momentum of the adhesive comes from the jetting action, proximity to the substrate (dispense gap) can be less critical than needle dispensing. Jetting can, in some cases, be faster than needle dispensing. The jet nozzle can build up a dot quickly by applying many shots of low-viscosity adhesive in the same location without disturbing the previously dispensed high-viscosity adhesive.

In some implementations, details of the screen printing, auger valve dispensing and/or dispense jetting techniques may differ from the specific details described above. In some cases, the deposited adhesive is cured partially at this stage. In some cases, forming the micro-spacers 128 by applying a die-cut pressure sensitive layer on one of the optical element layers 122, 124 can obviate the need for curing.

Figure 5:
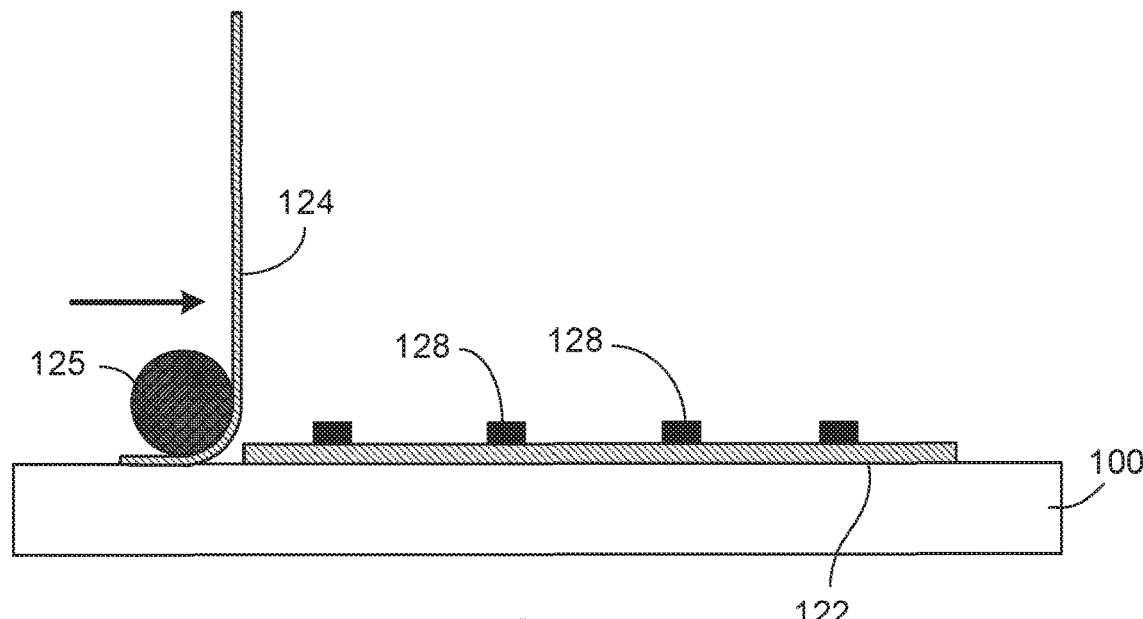

Next, as shown in FIG. 5, a second optical element layer 124 is applied over the first micro-spacers 128. In some cases, the second optical element layer 124 is applied using a roller 125. In other cases, the second optical element layer 124 is applied by a vacuum chuck (see, e.g., FIG. 14). Depending on the implementation the second optical element layer 124 can be, for example, an IR absorber layer, a dielectric optical filter layer, or an optical interference filter layer. The first and second optical element layers 122, 124 can be of the same type or of different types. The adhesive forming the first micro-spacers 128 then can be cured fully.

Figure 6:
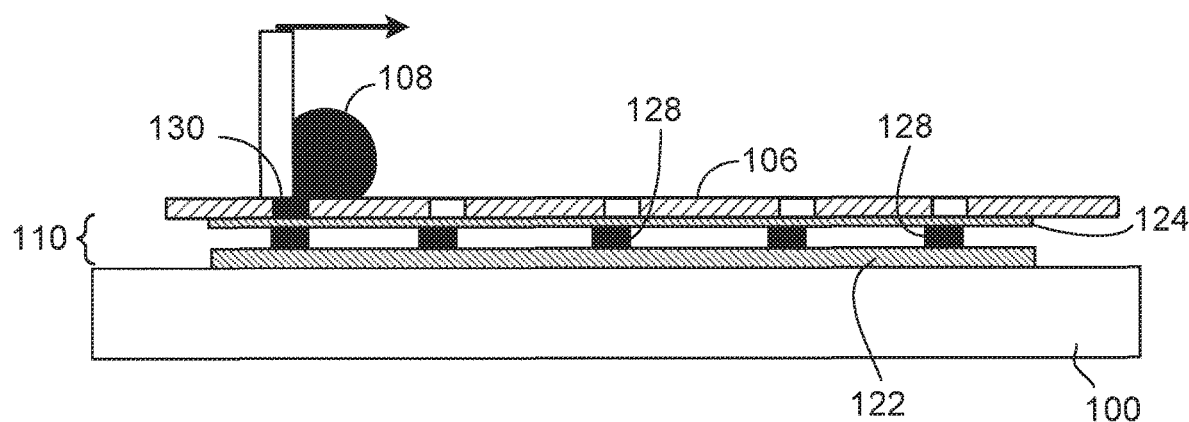

Next, as shown in FIG. 6, second micro-spacers 130 are formed on the surface of the second optical element layer 124. Various techniques can be used to provide the second micro-spacers 130. Thus, in some implementations, a screen-printing, auger valve dispensing or jetting technique can be used. For example, in a screen-printing technique, adhesive (e.g., a black, heat curable epoxy such as LOCTITE® 3128™ epoxy) 108 can be pushed through a screen 106 for formation of the micro-spacers 130. In some cases, the micro-spacers 130 can be formed by applying a die-cut pressure sensitive layer on the optical element layer 124. The second micro-spacers 130 can be formed using a technique that is the same or different from the technique used to form the first micro-spacers 128. The micro-spacers 130 also can have a height in some instances on the order of tens of microns (e.g., 20-50.mu.m). In some cases, the adhesive is cured partially at this stage. In some instances, pressure can be applied, for example, in a high pressure chamber (e.g. 30 psi) or by placing a weight on top of the stack of optical elements and micro-spacers. The result is an optical sub-assembly wafer 110 that includes the first and second optical element layers 122, 124 separated by the first micro-spacers 128, as well as the second micro-spacers 130 projecting from the opposite side of the second optical element layer 130.

Figure 7:
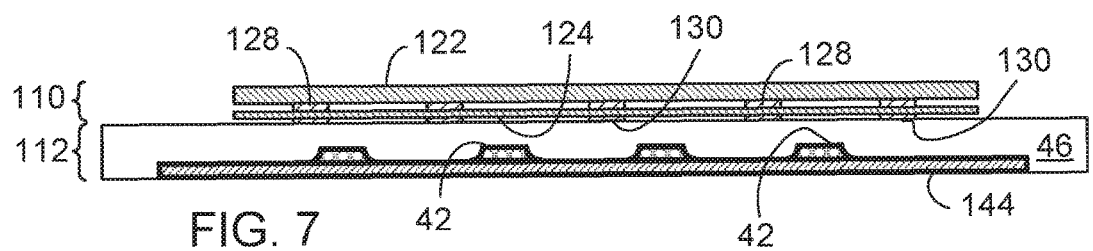

The optical sub-assembly wafer 110 can be removed from the substrate 100 and mounted, for example, onto an optoelectronic module wafer 112, as shown in FIG. 7. The optoelectronic module wafer 112 includes a PCB wafer 144 on which are mounted multiple devices 42 (e.g., light emitters or light sensors) covered by clear encapsulant 46. As shown in FIG. 7, the second micro-spacers 130 of the sub-assembly 110 can be placed onto the encapsulant 46 of the optoelectronic module wafer 112. The adhesive for the second micro-spacers 130 then can be cured fully, which causes the second micro-spacers 130 to adhere to the encapsulant 46.

In an alternative process, instead of forming the second micro-spacers 130 on the second optical element layer 124, they are deposited onto the surface of the encapsulant 46 of the optoelectronic module wafer 112. In that case, the sub-assembly would include the first and second optical element layers 122, 124 separated by the first micro-spacers 128, but would not include the second micro-spacers 130 projecting from the second optical element layer 124. Nevertheless, the optical sub-assembly and optoelectronic module wafer would be attached to one another in a similar manner as described above such that the second micro-spacers 130 separate the second optical element layer 124 from the encapsulant 46 as illustrated in FIG. 7.

Figure 8:
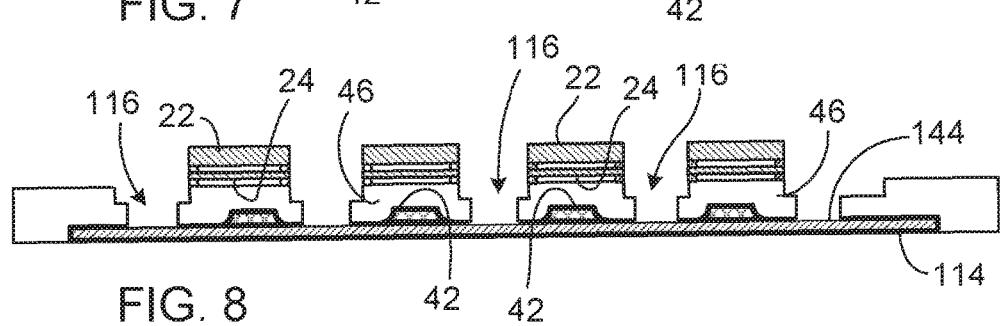

Prior to further processing, the combination of the optical sub-assembly 110 and optoelectronic module wafer 112 can be placed onto a carrier wafer 114 (see FIG. 8). Then, trenches 116 are formed, for example, by dicing through the first and second optical element layers 122, 124 in regions that do not correspond to the optoelectronic modules. In some cases, the trenches 116 extend through the encapsulant 46 and may even extend slightly (e.g., 20.mu.m) into the upper surface of the PCB wafer 144. The remaining portions of the optical element layers 122, 124 form the first and second optical elements 22, 24 of each module, respectively.

Figure 9:
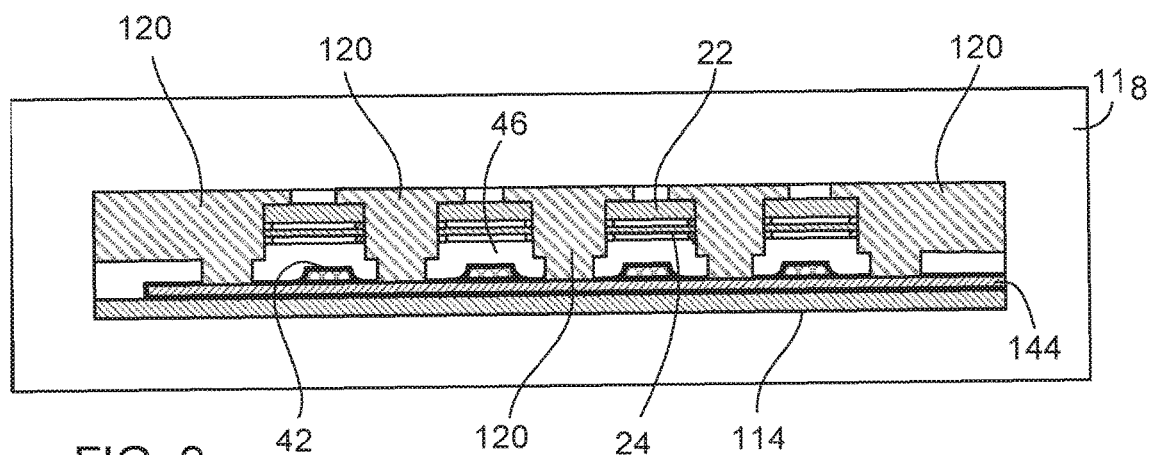

Following formation of the trenches 116, the resulting assembly can be placed, for example, into PDMS tools 118 (see FIG. 9), and a vacuum injection molding or other technique can be used to fill the trenches 116 with transparent or opaque material 120 and thereby laterally encapsulate the edges of the optical elements 22, 24. If the trenches 116 extend to the surface of the PCB wafer 144, then the vacuum injected molding material can provide sidewalls for the resulting modules as well. The vacuum injected molding material then can be cured (e.g., by UV and/or thermal curing).

Figure 10:
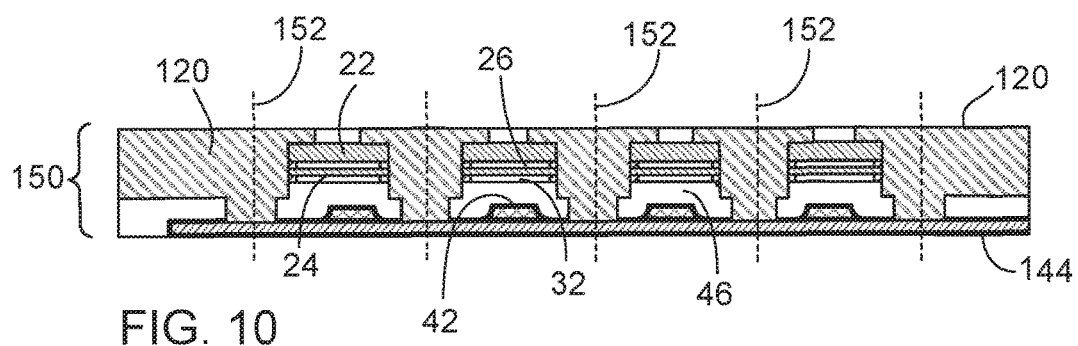

As indicated by FIG. 10, the resulting assembly 150 is removed from the PDMS tools 118, and the carrier wafer 114 is removed from the assembly 150. The assembly 150 then can be singulated (e.g., by dicing) along lines 152 so as to form multiple modules 40 as in FIG. 2.

In the foregoing example, the first and second micro-spacers 28, 30 are shown as being aligned with one another such that first micro-spacer 28 is directly above the second micro-spacer 30. In some implementations, however, the first and second micro-spacers 28, 30 need not be aligned directly over one another. An example of such an implementation is described below in connection with FIG. 28.

In the foregoing example of FIGS. 7-10, the optical sub-assembly wafer 110 is mounted on an optoelectronic module wafer 112 and, after subsequent processing, the resulting wafer assembly 150 is singulated (e.g., by dicing) into multiple modules. Dicing the resulting wafer assembly 150, however, may present challenges in some cases. Thus, in some implementations, instead of mounting an entire optical sub-assembly wafer 110 on the optoelectronic module wafer 112, the optical sub-assembly wafer 110 is separated (e.g., by dicing or laser cutting) into individual optical sub-assemblies, which then are arranged on the optoelectronic module wafer 112. In some cases, this method can help increase the overall yield. An example of this method is described in greater detail in the following paragraphs.

Figure 11:
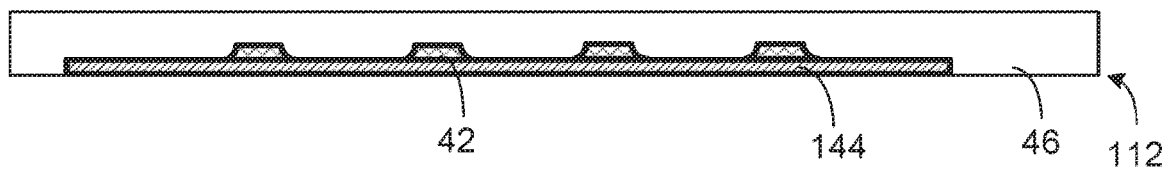
FIGS. 11-15 illustrate steps in another wafer-level manufacturing process for making optoelectronic modules.
Figure 12:
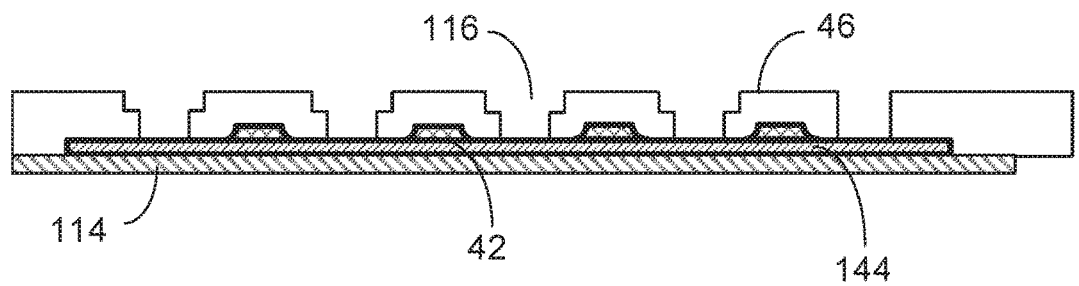

As shown in FIG. 11, a PCB wafer 144 on which are mounted multiple devices 42 (e.g., light emitters or light sensors) is covered by clear encapsulant 46 to form an optoelectronic module wafer 112. Then, as shown in FIG. 12, trenches 116 are formed, for example, by dicing into the encapsulant 46 in areas separating the devices 42 from one another. In some cases, the trenches 116 extend through the encapsulant 46 and may even extend slightly (e.g., 20.mu.m) into the upper surface of the PCB wafer 144.

Figure 13:
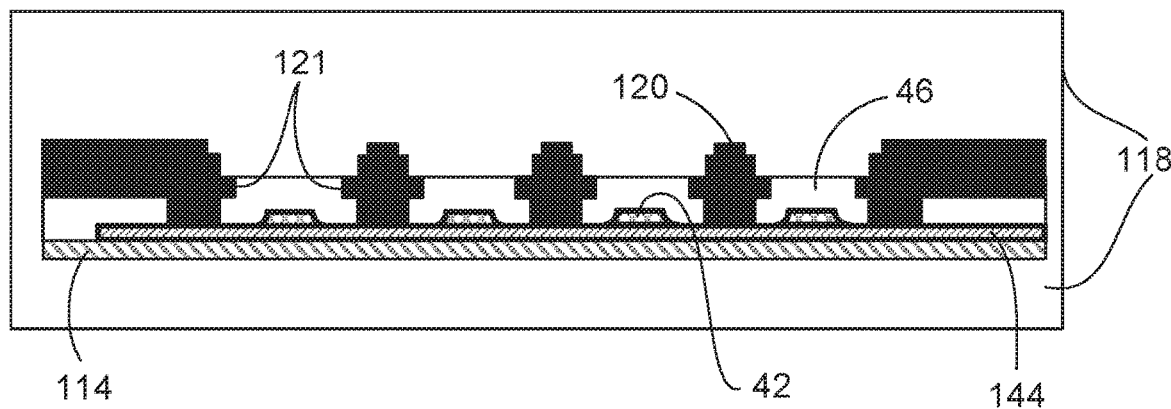

Following formation of the trenches 116, the resulting assembly can be placed on a carrier 114 and disposed, for example, within PDMS tools 118 (see FIG. 13). A vacuum injection molding or other technique then can be used to fill the trenches 116 with transparent or opaque material (e.g., black epoxy) 120. For example, in some cases, the material injected into the trenches is opaque to a wavelength or range of wavelengths of radiation emitted by or detectable by the devices 42. The vacuum injected molding material subsequently can be cured (e.g., by UV and/or thermal curing). The vacuum injected molding material thus can provide sidewalls for the modules. Also, portions 121 of the material 120 serve as support spacers on which the individual optical sub-assemblies can subsequently be placed (see FIG. 15).

Figure 14:
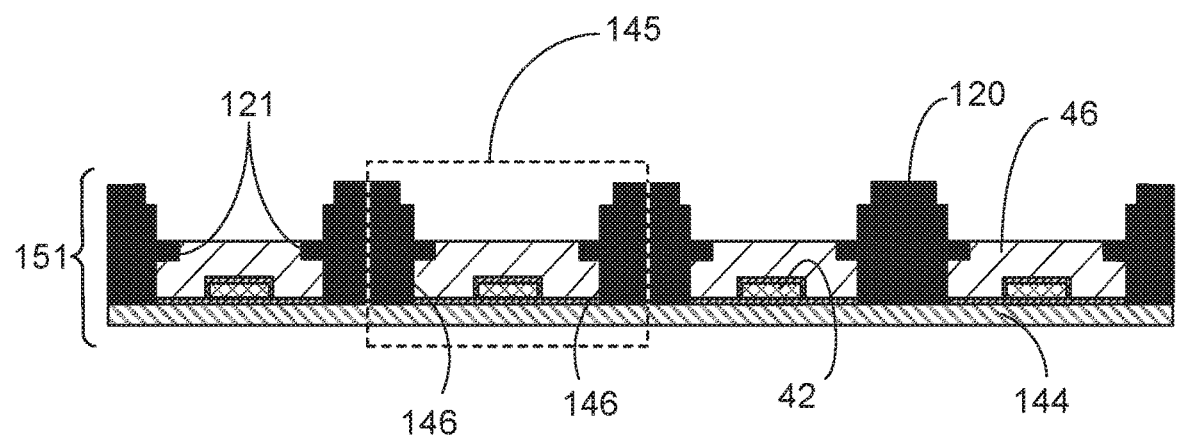
Figure 15:
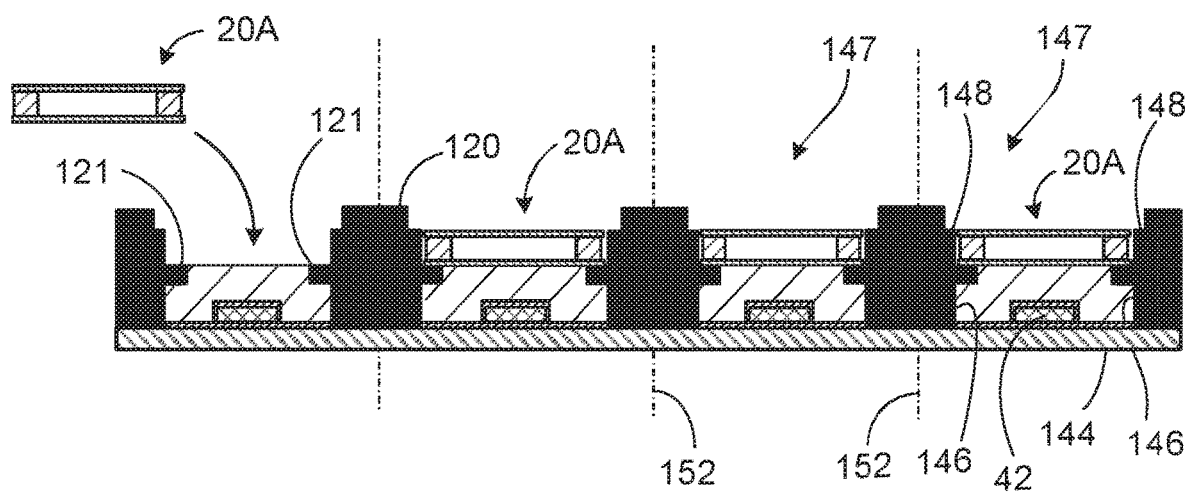

As indicated by FIG. 14, the resulting assembly 151 is removed from the PDMS tools 118, and the carrier wafer 114 is removed from the assembly 151. Then, as shown in FIG. 15, individual optical sub-assemblies 20A are placed onto the support spacers 121, for example, by pick-and-place equipment. The optical sub-assemblies 20A can be similar, for example, to the sub-assembly 220 described below in connection with FIG. 20. The assembly 151 then can be separated (e.g., by dicing) along lines 152 to form multiple modules. Alternatively, in some instances, the optoelectronic sub-assembly wafer 151 is singulated, and then the singulated optoelectronic sub-assemblies 145 and individual sub-assemblies 20A can be assembled by pick-and-place equipment.

Each optoelectronic sub-assembly 145 thus includes an optoelectronic device 42 mounted on a PCB or other substrate. The device 42 is laterally surrounded by opaque walls 146 that are seamlessly formed with a support spacer 121 composed of the same material (e.g., black epoxy) as the walls. The support spacer 121 can project from the walls 146 toward the interior space of the sub-assembly and can have an opening directly over the device 42. Thus, the support spacer 121 in some instances, forms an annular shaped ledge. The material of the walls 146 and the support spacer 121 can be opaque to one or more wavelengths of radiation emitted by or detectable by the device 42. As shown in FIG. 15, each optoelectronic module 147 can include an optical sub-assembly 20A disposed on the support spacer 121 such that the optical sub-assembly 20A is disposed over the device 42. In some cases, the walls 146 include a second support ledge 148 to support a light guide or other optical component stacked over the optical sub-assembly 20A (see, e.g., FIG. 19 below). The second ledge 148 can be formed, for example, as an annular shaped indentation in the walls 146 such that the first and second ledges 121, 148 and the walls 146 are a seamless unitary piece. As illustrated in FIGS. 14 and 15, the second ledge 148 can have a larger diameter than the first ledge 121, which is closer to the device 42 than the second ledge 148.

Figure 28:
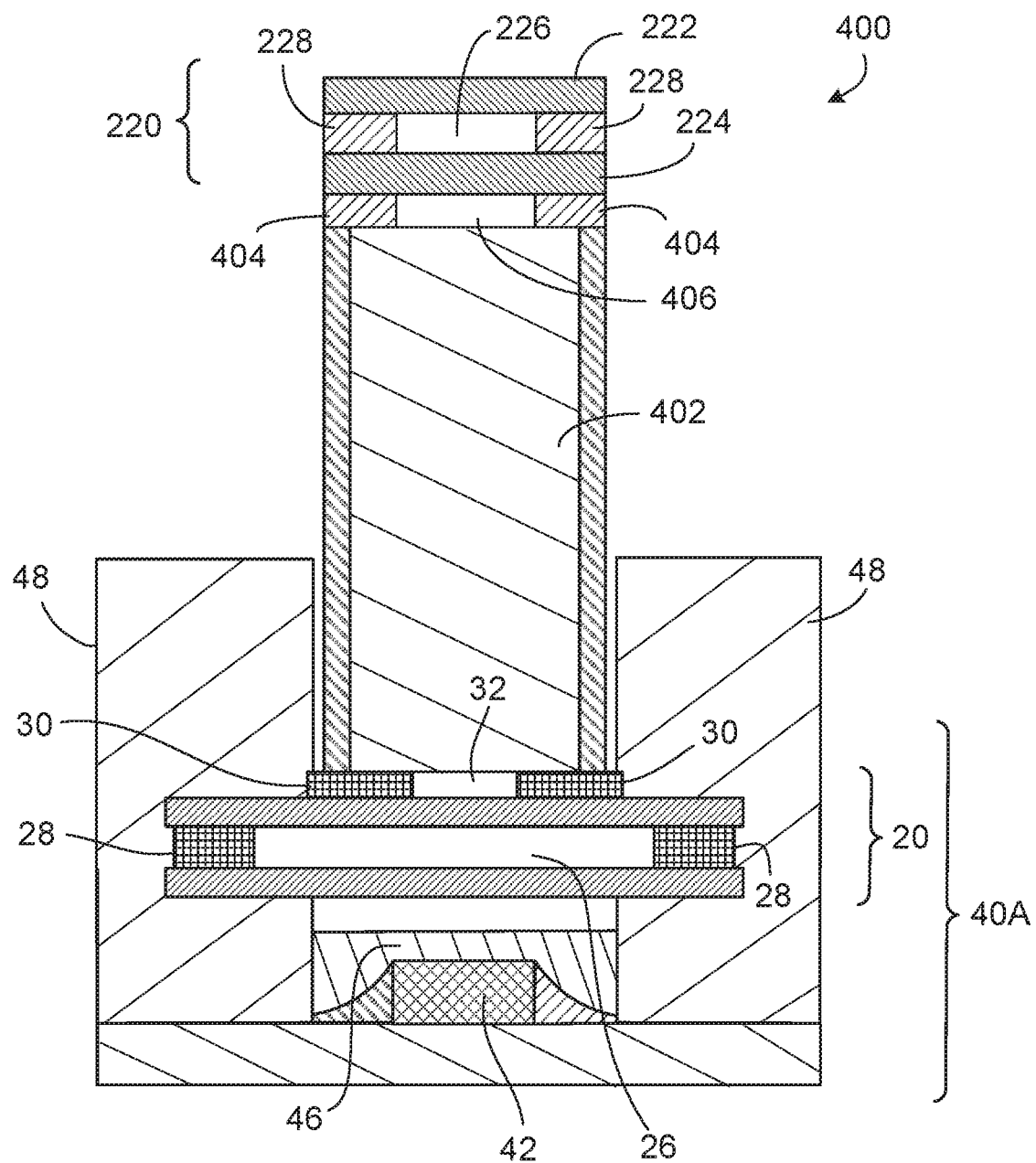
FIG. 28 illustrates an example of an optoelectronic module that includes optical assemblies having one or more micro-spacers.

In some instances, a light guide and/or optical diffuser can be placed over each optical sub-assembly 20A (see FIG. 28). The light guides and optical diffusers can be placed over the sub-assemblies 20A either before or after dicing the assembly 151 into individual modules.

The foregoing implementations include providing an optoelectronic module wafer 112 (including PCB wafer 144 on which are mounted devices 42) and attaching the optical subassembly wafer 110 or individual optical subassemblies 20A to the optoelectronic module wafer 112. In other implementations, instead of providing an optoelectronic module wafer 112, a singulated sub-assembly module can be attached to a flexible cable on which a device 42 is mounted. An example of such a process is illustrated in the following paragraphs.

Figure 16:
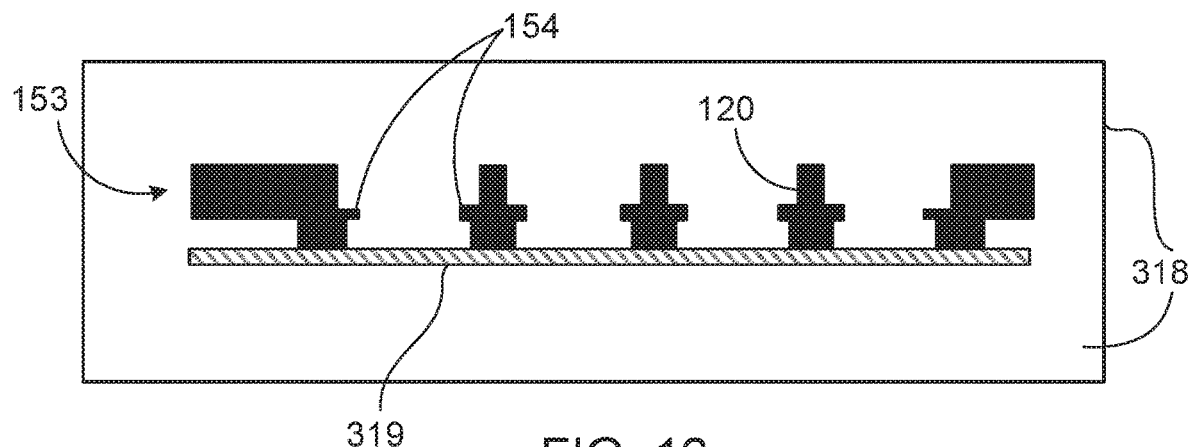
FIGS. 16-18 illustrate steps in yet another wafer-level manufacturing process for making optoelectronic modules.
Figure 17:
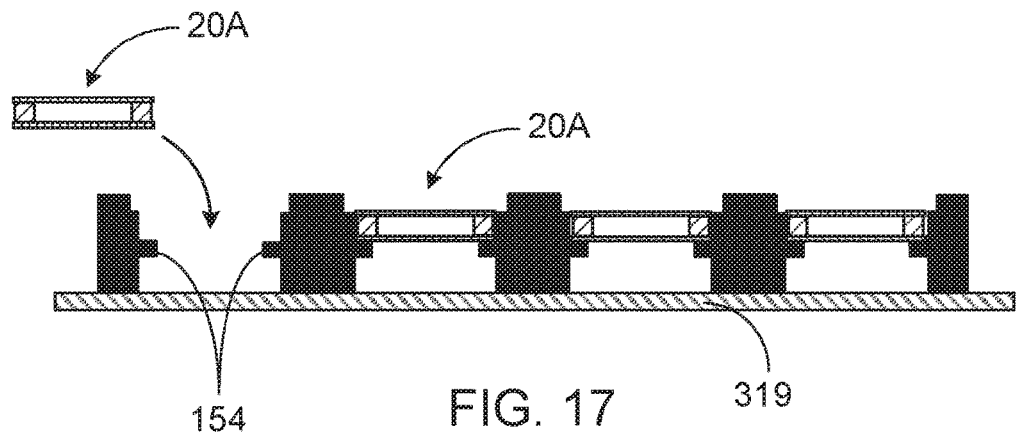
Figure 18:
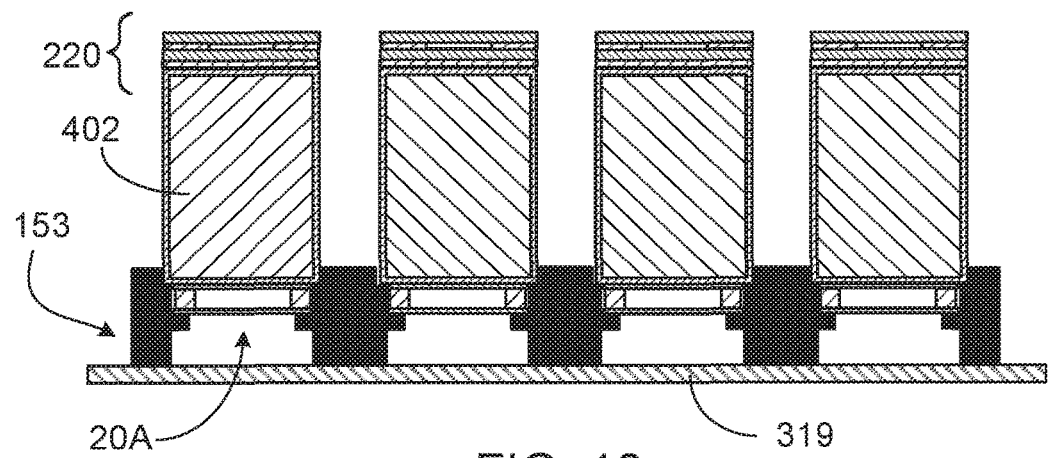
Figure 19:
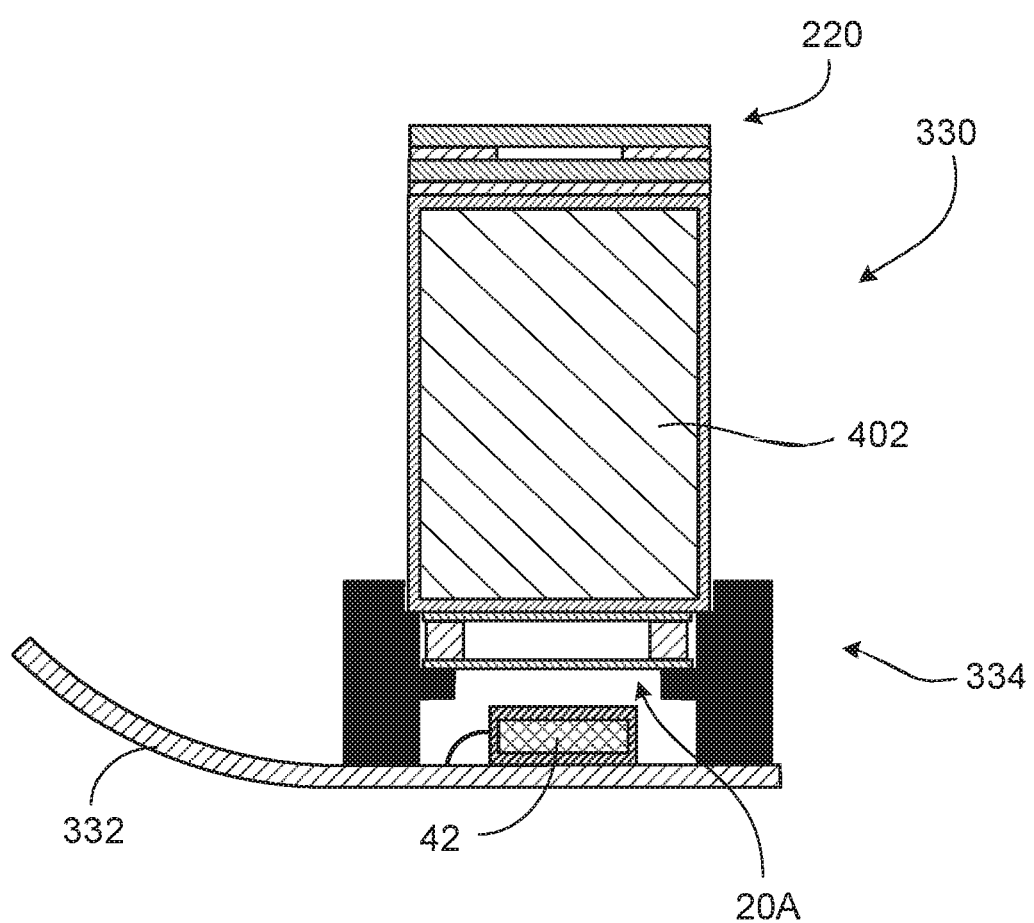
FIG. 19 illustrates an example of an optoelectronic module that can be obtained using the process of FIGS. 16-18.

As illustrated in FIG. 16, PDMS tools 318 can be used to define spaces into which opaque material 120 for a spacer-wall formation 153 can be provided, for example, by a vacuum injection molding or other technique. The spacer-wall formation 153 can be formed on a carrier wafer or other support 319 and includes support spacers 154 onto which the optical sub-assemblies 20A can be subsequently placed. At this point, the spacer-wall formation 153 can be singulated (e.g., by dicing), and then singulated spacer-wall sub-assemblies and individual sub-assemblies can be assembled, for example, by-pick-and place equipment. Alternatively, in some instances, the spacer-wall formation 153 is removed from the tools 318, and individual optical sub-assemblies 20A are placed onto the support spacers 121, for example, by pick-and-place equipment (see FIG. 17). The carrier 319 then can be removed from the spacer-wall formation 153. In some instances, a light guide 402 and/or optical diffuser 220 can be placed over each optical sub-assembly 20A (see FIG. 18). After dicing, individual modules 330 (either with or without the light guide 402 and optical diffuser 220) can be attached to a flexible cable 332 on which is mounted a device 42, as shown in FIG. 19. The module 330 of FIG. 19 thus includes one or more optical sub-assemblies 20A, 220 and a light guide 402 stacked over a sensor sub-assembly 334 that is mounted to a flexible cable 332.

Figure 20:
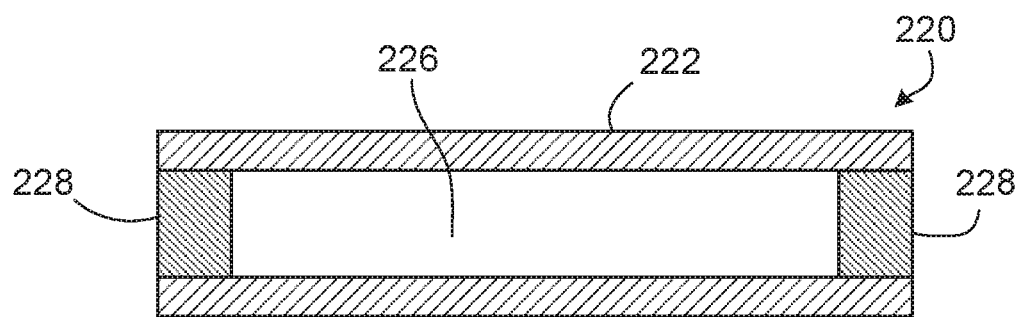
FIG. 20 illustrates another example of an optical sub-assembly that includes a micro-spacer.

FIG. 20 illustrates an example of a sub-assembly 220 that includes a stack of a first optical element 222 and a second optical element 224 separated from one another by a small air or vacuum gap 226. A micro-spacer 228 separates the first and second optical elements 222, 224 from one another by a fixed distance. The following paragraphs describe an example of a wafer-level method of manufacturing multiple sub-assemblies 220 in parallel. The micro-spacer 228 can have, for example, an annular shape or a closed rectangular loop shape that laterally surrounds the air or vacuum gap 226. The following paragraphs describe an example of a wafer-level method of manufacturing sub-assemblies 220 that include micro-spacers 228.

Figure 21:
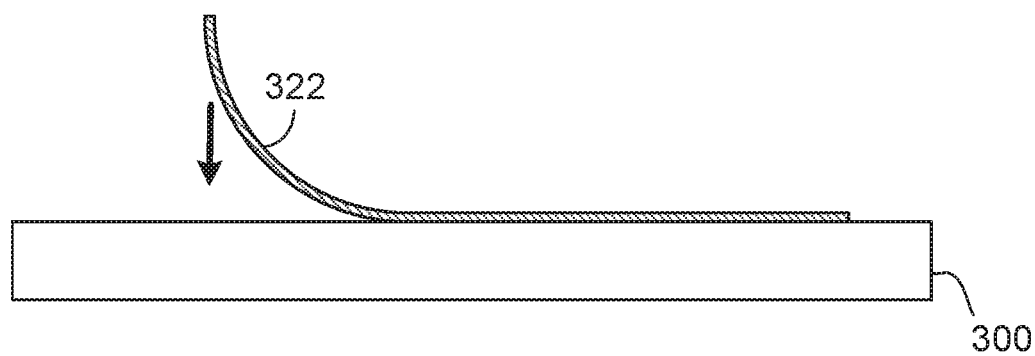
FIGS. 21, 22, 23, 24 and 25 illustrate steps in another wafer-level manufacturing process for making optical sub-assemblies that include micro-spacers.
Figure 22:
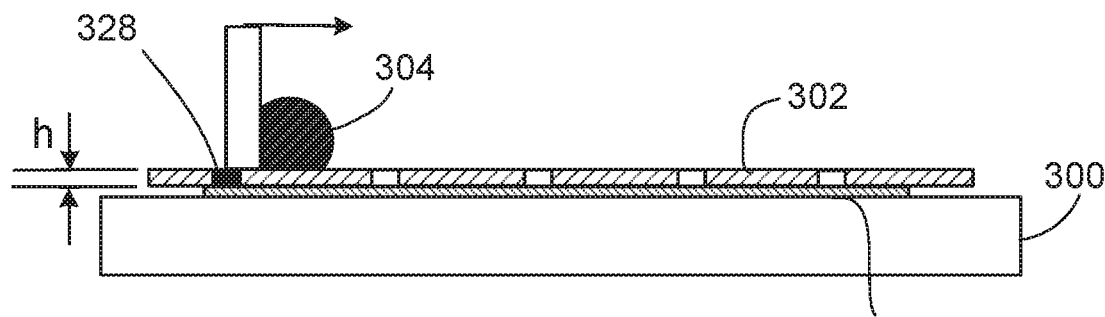

As shown in FIG. 21, a first optical element layer 322 is mounted on a substrate 300 composed, for example, of PDMS, which provides good adherence, but which allows the substrate to be removed relatively easily during subsequent processing. Depending on the implementation the first optical element layer 322 can be, for example, an IR absorber layer, a dielectric optical filter layer, or an optical interference filter layer. Next, as shown in FIG. 22, micro-spacers 328 are formed (e.g., by screen-printing, auger valve dispensing or jetting) on the surface of the first optical element layer 322. For this purpose, adhesive (e.g., a black, heat curable epoxy such as LOCTITE® 3128™ epoxy available from Henkel Technologies) 304 can be pushed through a screen 302 for formation of the micro-spacers 328. In some cases, the micro-spacers 328 can be formed by applying a die-cut pressure sensitive layer on one of the optical element layers. The micro-spacers 328 can have a height (h) in some instances on the order of tens of microns (e.g., 20-50.mu.m). In some cases, the adhesive is cured partially at this stage.

Figure 23:
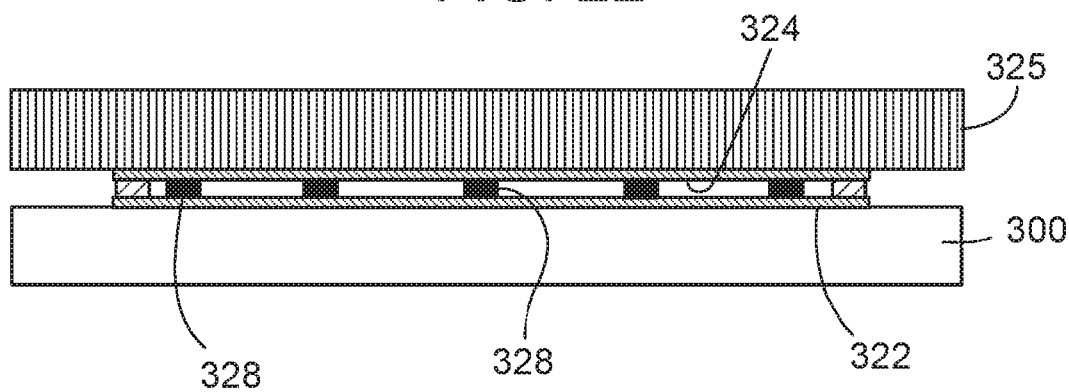
Figure 24:
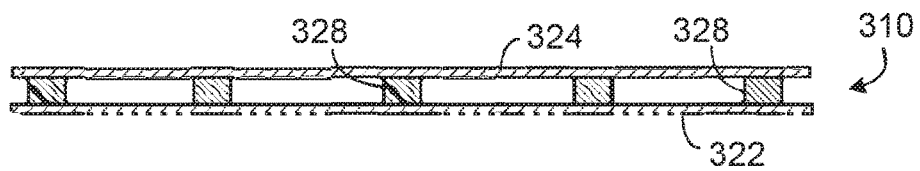

Next, as shown in FIG. 23, a second optical element layer 324 is applied over the micro-spacers 328. In other cases, the second optical element layer 324 is applied by using a vacuum chuck 325 that holds the optical element layer 324, places it on the micro-spacers 328, and then releases the optical element layer 324. In some cases, the second optical element layer 324 is applied using a roller (see, e.g., FIG. 4A). Depending on the implementation the second optical element layer 324 can be, for example, an IR absorber layer, a dielectric optical filter layer, or an optical interference filter layer. The first and second optical element layers 322, 324 can be of the same type or of different types. The adhesive forming the micro-spacers 328 then can be cured fully. The result is an optical sub-assembly wafer 310 that includes the first and second optical element layers 322, 324 separated by the micro-spacers 328 (see FIG. 24).

Figure 25:
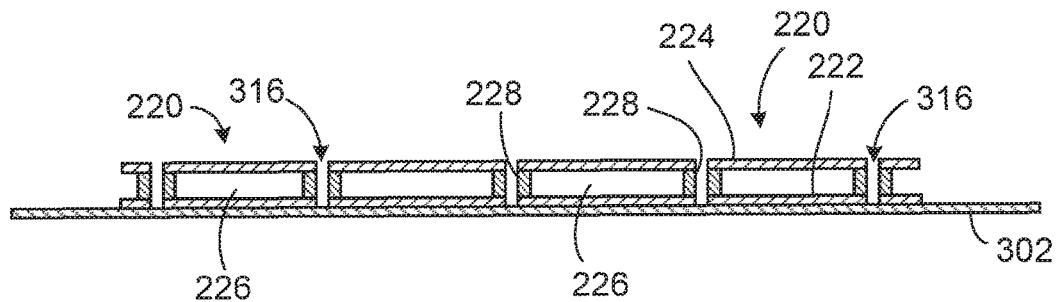

The resulting optical sub-assembly wafer 310 is removed from the PDMS substrate 300 and is placed, for example, onto UV dicing tape 302 (see FIG. 25). Then, trenches 316 are formed, for example, by dicing through the first optical element layers 322, 324 and the micro-spacer 328 that separates the layers 322, 324 from one another. The dicing results in multiple sub-assemblies 220 that include micro-spacers 228 separating the first and second optical elements 222, 224. Each sub-assembly 220 has an air gap 226 between the first and second optical elements 222, 224. In some instances, the sub-assemblies 220 then are removed from the dicing tape 302 and can be integrated, for example, into optoelectronic modules (see, e.g., FIG. 28).

In some instances, multiple layers, including a laser-cut pressure sensitive adhesive, can be laminated onto one another. The other layers can include infra-red (IR) absorption and/or optical diffuser layers laminated over both sides of the pressure sensitive adhesive. The optical stack then can be singulated into individual optical subassemblies.

Figure 26:
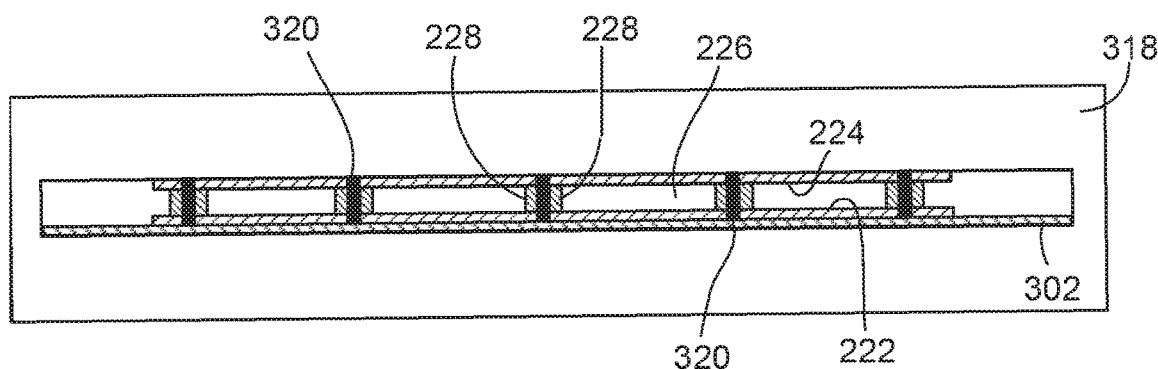
FIGS. 26 and 27 illustrate additional steps that can be included in some wafer-level manufacturing process for making optical sub-assemblies.

In some implementations, it may be desirable to encapsulate the side edges of the optical elements 222, 224 and the micro-spacers 228, for example, with an opaque or transparent material. As shown, for example, in FIG. 26, while the sub-assemblies 220 are still attached to the dicing tape 302, they can be placed into PDMS tools 318, and a vacuum injection molding or other technique can be used to fill the trenches 316 with opaque (or transparent) material 320 and thereby laterally encapsulate the edges of the optical elements 222, 224. The vacuum injected molding material 320 then can be cured (e.g., by UV and/or thermal curing).

Figure 27:
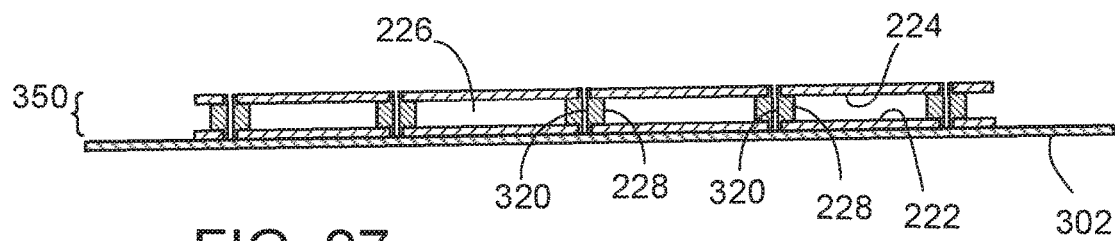

As indicated by FIG. 27, the resulting assembly 350 is removed from the PDMS tools 318. The assembly 350 then can be singulated (e.g., by dicing) so as to form multiple optical sub-assemblies 220A that include micro-spacers 228 separating the first and second optical elements 222, 224 whose side edges are laterally surrounded by opaque (or transparent) material. Each sub-assembly 220A has an air gap 226 between the first and second optical elements 222, 224. The dicing tape 302 can be removed from the sub-assemblies 220A prior to their being incorporated, for example, into optoelectronic modules.

In some implementations, wafer-level manufacturing of optical sub-assemblies such as sub-assembly 20 (FIG. 1) and assembly 220 (FIG. 20) can be combined to provide more complex modules. An example is illustrated in FIG. 28, which shows a module 400 that includes an optical sub-assembly 220 disposed over a light guide 402, which in turn is disposed over an optoelectronic module 40A that includes a sub-assembly 20. The sub-assembly 220 can be separated from the light guide 402, for example, by another micro-spacer 404. Likewise, the light guide 402 can be disposed on the second micro-spacer 28 in the optoelectronic module 40. As is apparent from FIG. 28, the micro-spacers 28, 30, 228, 404 allow the various optical elements 22, 24, 222, 224 to be adjacent respective air gaps 26, 32, 226, 406.

Various modifications may be made within the spirit of the invention, and features described above in connection with different embodiments can, in some cases, be combined in the same implementation. Thus, other implementations are within the scope of the claims.

What is claimed is:

1. An optoelectronic module comprising:
an optoelectronic device mounted on a substrate;
a first optical sub-assembly including a first optical element and a first micro-spacer on the first optical element, wherein the first optical sub-assembly disposed over the optoelectronic device, a first air or vacuum gap separating the first optical element from the optoelectronic device, and wherein the first micro-spacer laterally surrounds the first air or vacuum gap;
wherein the first optical sub assembly includes a second optical element, the first and second optical elements being separated by a second air or vacuum gap laterally surrounded by a second micro-spacer; and
a second optical sub-assembly including third and fourth optical elements separated by a third air or vacuum gap laterally surrounded by a third micro-spacer.

2. The optoelectronic module of claim 1 wherein each micro-spacer is composed of an adhesive material.

3. The optoelectronic module of claim 1, wherein the second optical sub-assembly is disposed over the first optical sub-assembly.

4. The optoelectronic module of claim 1, further comprising a light guide located between the first optical assembly and the second optical assembly.

5. The optoelectronic module of claim 1, further comprising an opaque material laterally encapsulating the edges of the first and second optical elements or the third and fourth optical elements.

6. The optoelectronic module of claim 1, wherein at least one of the first, second, third, or fourth optical elements comprises an IR absorber layer, a dielectric optical filter layer, or an optical interference filter layer.

* * * * *